(12) United States Patent
Mazumder

(10) Patent No.: US 10,984,850 B2
(45) Date of Patent: Apr. 20, 2021

(54) APPARATUSES AND METHODS FOR SWITCHING REFRESH STATE IN A MEMORY CIRCUIT

(71) Applicant: MICRON TECHNOLOGY, INC., Boise, ID (US)

(72) Inventor: Kallol Mazumder, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/796,696

(22) Filed: Feb. 20, 2020

(65) Prior Publication Data

US 2020/0194055 A1 Jun. 18, 2020

Related U.S. Application Data

(63) Continuation of application No. 16/022,378, filed on Jun. 28, 2018, now Pat. No. 10,607,681.

(51) Int. Cl.
*G11C 11/406* (2006.01)
*G11C 11/4076* (2006.01)
*G11C 11/409* (2006.01)

(52) U.S. Cl.
CPC ...... *G11C 11/40615* (2013.01); *G11C 11/409* (2013.01); *G11C 11/4076* (2013.01)

(58) Field of Classification Search
None
See application file for complete search history.

(56) References Cited

U.S. PATENT DOCUMENTS

| 2011/0026339 | A1 | 2/2011 | Hayashi et al. |
| 2011/0242923 | A1 | 10/2011 | Song |
| 2012/0155212 | A1 | 6/2012 | Kodama |
| 2014/0052878 | A1 | 2/2014 | Ito et al. |
| 2014/0376326 | A1 | 12/2014 | Lee et al. |
| 2015/0048894 | A1* | 2/2015 | Ma ............... H03L 7/00 331/1 A |

FOREIGN PATENT DOCUMENTS

CN 105280220 A 1/2016

OTHER PUBLICATIONS

International Search Report and Written Opinion received in PCT Application No. PCT/US2019/038762 dated Oct. 8, 2019.

* cited by examiner

*Primary Examiner* — James G Norman
(74) *Attorney, Agent, or Firm* — Dorsey & Whitney LLP

(57) ABSTRACT

An apparatus may include a semiconductor device that includes an internal clock circuit configured to receive an internal clock signal and to provide a local clock signal based on the internal clock signal. The internal clock circuit comprises a clock synchronizer configured to, in response to receipt of a command to exit a self-refresh mode, disable provision of the local clock signal by a number of cycles of the internal clock signal.

20 Claims, 6 Drawing Sheets

APPARATUSES AND METHODS FOR SWITCHING REFRESH STATE IN A MEMORY CIRCUIT

CROSS-REFERENCE TO RELATED APPLICATION

This application is a continuation of U.S. patent application Ser. No. 16/022,378, filed Jun. 28, 2018 and issued as U.S. Pat. No. 10,607,681 on Mar. 31, 2020. These application and patent are incorporated by reference herein in their entirety and for all purposes.

BACKGROUND

Memory devices, such as dynamic random access memory (DRAM), require self-refresh in order to maintain the electric charge and data value in each memory cell. During some modes of operation, some circuit components may remain inactive for long periods of time. During these inactive periods, a negative-bias temperature instability (NBTI) effect may occur in some transistors, such as metal-oxide-semiconductor field-effect transistor (MOSFET). NBTI describes a scenario where a gate to source voltage of a transistor is negative, which may cause a change in the threshold voltage, and thus a degradation of the affected transistor. Some methods for avoiding NBTI include periodically toggling of signals that control the normally inactive circuitry, but some artifacts of the signal toggling may remain when a memory device changes to a different mode of operation, and may result in spurious incorrect data from being transmitted.

BRIEF DESCRIPTION OF THE DRAWINGS

The present solution will be described with reference to the following figures, in which like numerals represent like items throughout the figures.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

Figure 1:
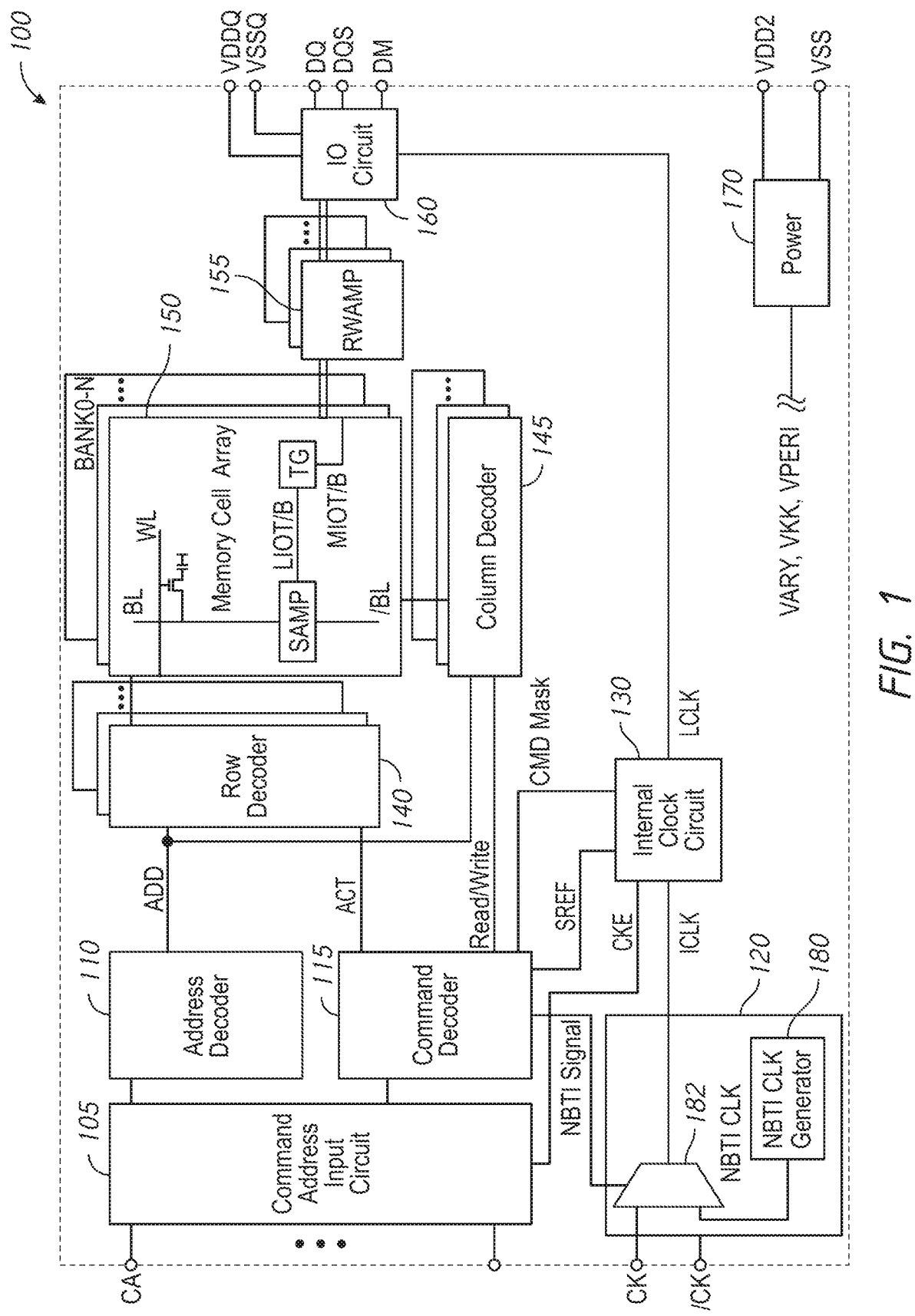
FIG. 1 illustrates a schematic block diagram of an example of a memory device in accordance with some examples disclosed herein.

FIG. 1 illustrates a schematic block diagram of an example of semiconductor device 100 in accordance with some examples disclosed herein. The semiconductor device 100 includes a memory die. The memory die may include a command/address input circuit 105, an address decoder 110, a command decoder 115, a clock input circuit 120, internal clock circuit 130, row decoder 140, column decoder 145, memory arrays 150, read/write amplifiers 155, I/O circuit 160, and power circuit 170.

In some examples, the semiconductor device 100 may include, without limitation, a DRAM device, such as double data rate (DDR) DDR4, DDR5, low power DDR (LPDDR), integrated into a single semiconductor chip, for example. The die may be mounted on an external substrate, for example, a memory module substrate, a mother board or the like. The semiconductor device 100 may further include a memory array 150. The memory array 150 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 140 and the selection of the bit line BL is performed by a column decoder 145. Sense amplifiers (SA) are located for their corresponding bit lines BL and connected to at least one respective local I/O line (LIOT/B), which is in turn coupled to a respective one of at least two main I/O line pairs (MIOT/B), via transfer gates (TG), which function as switches.

The semiconductor device 100 may operate in a normal operation mode and a self-refresh mode. In normal operation mode, data read or write is enabled, whereas in self-refresh mode, data read or write is disabled. The semiconductor device 100 may employ a plurality of external terminals that include address and command terminals coupled to command/address bus (C/A), clock terminals CK and /CK, data terminals DQ, DQS, and DM, power supply terminals VDD2, VSS, VDDQ, and VSSQ.

The command/address terminals may be supplied with an address signal and a bank address signal from outside. The address signal and the bank address signal supplied to the address terminals are transferred, via the command/address input circuit 105, to an address decoder 110. The address decoder 110 receives the address signal and decodes the address signal to provide decoded address signal ADD. The ADD signal includes a decoded row address signal and a decoded column address signal. The decoded row address signal is provided to the row decoder 140, and a decoded column address signal is provided to the column decoder 145. The address decoder 110 also receives the bank address signal and supplies the bank address signal to the row decoder 140, the column decoder 145.

The command/address terminals may further be supplied with a command signal from outside, such as, for example, a memory controller. The command signal may be provided, via the C/A bus, to the command decoder 115 via the command/address input circuit 105. The command decoder 115 decodes the command signal to generate various internal commands that include a row command signal ACT to select a word line and a column command signal Read/Write, such as a read command or a write command, to select a bit line, and a command to enter or exit self-refresh mode.

Accordingly, when a read command is issued and a row address and a column address are timely supplied with the read command, read data is read from a memory cell of the memory array 150 designated by these row address and column address. The read data DQ is output to outside from the data terminals DQ (data), DQS (data strobe), and DM (data mask) via read/write amplifiers 155 and an input/output circuit 160. Similarly, when the write command is issued and a row address and a column address are timely supplied with this command, and then write data is supplied to the data terminals DQ, DQS, DM, the write data is received by data receivers of the input/output circuit 160, and supplied via the input/output circuit 160 and the read/write amplifiers 155 to the memory array 150 and written to the memory cell designated by the row address and the column address.

Turning to the explanation of the external terminals of the semiconductor device 100, the clock terminals CK and /CK are supplied with an external clock signal and a complementary external clock signal, respectively. The external clock signals (including complementary external clock signal) may be supplied to a clock input circuit 120. The clock input circuit 120 may receive the external clock signals to generate an internal clock signal ICLK. The ICLK signal is supplied to an internal clock circuit 130, which may be configured to receive the ICLK signal and generate a local clock signal LCLK based on the received ICLK signal. Although not limited thereto, the internal clock circuit 130 may include a delay-locked loop (DLL) circuit, a duty cycle correction (DCC) circuit, or a combination thereof, to generate the LCLK signal from the internal clock signal ICLK. The LCLK signal is supplied to the input/output circuit 160 and is used as a timing signal for determining timing of I/O operations. In other words, the input/output circuit 160 may be configured to transmit or receive data responsive to the LCLK signal.

The power supply terminals are supplied with power supply potentials VDD and VSS. These power supply potentials VDD2 and VSS are supplied to an internal voltage generator circuit 170. The internal voltage generator circuit 170 generates various internal potentials VARY, VKK, VPERI, and the like based on the power supply potentials VDD2 and VSS. The internal potential VARY is mainly used in the sense amplifiers of the memory array 150, the internal potential VKK is mainly used in the row decoder 140, and the internal potential VPERI is used in many other circuit blocks.

The power supply terminals are also supplied with power supply potentials VDDQ and VSSQ. These power supply potentials VDDQ and VSSQ are supplied to the input/output circuit 160. The power supply potentials VDDQ and VSSQ are typically the same potentials as the power supply potentials VDD2 and VSS, respectively. However, the dedicated power supply potentials VDDQ and VSSQ are used for the input/output circuit 160 so that power supply noise generated by the input/output circuit 160 does not propagate to the other circuit blocks.

With further reference to FIG. 1, the clock input circuit 120 may be configured to receive the CK and /CK signals. Clock input circuit 120 may also include a NBTI clock generator 180 that is configured to generate an NBTI clock signal NBTI CLK. In some examples, NBTI CLK signal may have a lower frequency than that of the CK and /CK signals. In some scenarios, clock input circuit 120 may have a switching circuit 182, for example, a multiplexer. The switching circuit 182 may be configured to receive a NBTI signal that controls which of the CK and /CK signal or the NBTI CLK signal is provided at an output as the ICLK signal. The NBTI signal may indicate entry into or exit from an NBTI clock mode. In some examples, the NBTI mode may be associated with a self-refresh mode or operation. In some examples, the NBTI signal may be supplied by command decoder 115. In other examples, the NBTI signal may be supplied by command address input circuit 105, or a refresh circuit that may be a portion of the command address input circuit 105, the command decoder 115, or any suitable component of the semiconductor device 100.

With further reference to FIG. 1, in some scenarios, the command address input circuit 105 may provide a clock enable signal CKE. The clock enable signal CKE indicates whether internal clock buffers of the clock input circuit 120 are enabled or disabled. In some examples, the clock enable signal CKE is set to a first value (e.g., an inactive state) in response to entry into the self-refresh mode and is set to a second value (e.g., an active state) in response to exit from the self-refresh mode. The internal clock circuit 130 may provide the LCLK signal in response to the clock enable signal CKE in some examples.

In some examples, in response to entry into the self-refresh mode from normal operation, the clock enable signal CKE may be set to the inactive state, and in response, the NTBI signal may transition from a first value to a second value. While in the self-refresh mode, the reading data from and writing data to the memory cell array 145 may be disabled. In response to exit from the self-refresh mode and entry into normal operation, the clock enable signal CKE may be set to an active state, and in response, the NTBI signal may transition from the second value to the first value. The NBTI signal may transition to the second value immediately, or may transition to the second value after a delay from the time the clock enable signal CKE is deactivated. Responsive to the NBTI signal, switching circuit 182 may toggle between the CK and /CK signals and the self-refresh clock signal NBTI CLK. In some examples, the CK and /CK signals may include higher frequency clock signal than the NBTI CLK signal, and in response, the frequency of the LCLK signal may also include a higher frequency clock signal. Thus, circuitry of the semiconductor device 100 may operate at a higher clock frequency when the ICLK signal is based on the CK and /CK signals. While the semiconductor device 100 is in normal operation (e.g., reading/writing data), the NBTI CLK signal may be deactivated, and the switching circuit 182 may provide the CK and /CK signal as the ICLK signal in response to the NBTI signal having the first value. The internal clock circuit 130 may provide the LCLK signal based on the ICLK signal.

In response to entering the self-refresh mode, the NBTI CLK signal may be activated, and the switching circuit 182 may provide the NBTI CLK signal as the ICLK signal in response to the NBTI signal transitioning to the second value. In some examples, lower power consumption may be desired during the self-refresh mode. However, completely turning off the ICLK signal (e.g., and the LCLK signal) may cause NBTI degradation in some circuitry of the semiconductor device 100. Thus, switching the ICLK signal to the lower frequency NBTI CLK signal may prevent NBTI in the semiconductor device 100 with less power consumption than using a clock having a higher frequency, such as a clock having a frequency of the CK and /CK signal.

In some scenarios, when the semiconductor device 100 exits the self-refresh mode NBTI CLK signal may be deactivated, and the switching circuit 182 may provide the CK and /CK signals as the ICLK signal in response to the NBTI signal transitioning to the first value. However, because the clock signals propagate through circuitry of the semiconductor device 100, including within the clock input circuit 120 and the internal clock circuit 130, artifacts on the ICLK signal and/or the LCLK signal when transitioning back to normal operation may result in command, address, and/or data being erroneously transmitted or received. Therefore, in response to an exit from the self-refresh mode, the internal clock circuit 130 may include circuitry that disables propagation of the LCLK signal and delays processing of commands in response to the transition from the self-refresh mode to normal operation. The internal clock circuit 130 may receive a self-refresh mode signal SREF from the command decoder 115 that indicates when a self-refresh mode is entered or exited. The internal clock circuit 130 may include a synchronizer that is configured to, in response to the SREFF signal (e.g., active-low complement of SREF signal) indicating an exit of the self-refresh mode, disable provision of the LCLK signal until the ICLK signal has toggled for a first preset number of cycles. The internal clock circuit 130 may further include a command mask circuit that is configured to, in response to the SREFF signal indicating an exit of the self-refresh mode, provide a CMD MASK signal that causes the command decoder 115 to delay processing of a received command until the ICLK signal has toggled a second preset number of clock cycles. In some examples, the first preset number of clock cycles is less than the second preset number of cycles. Disabling the LCLK signal and disabling processing of received commands for a period of time may reduce an opportunity for data to be incorrected interpreted, transmitted, or received.

Figure 2:
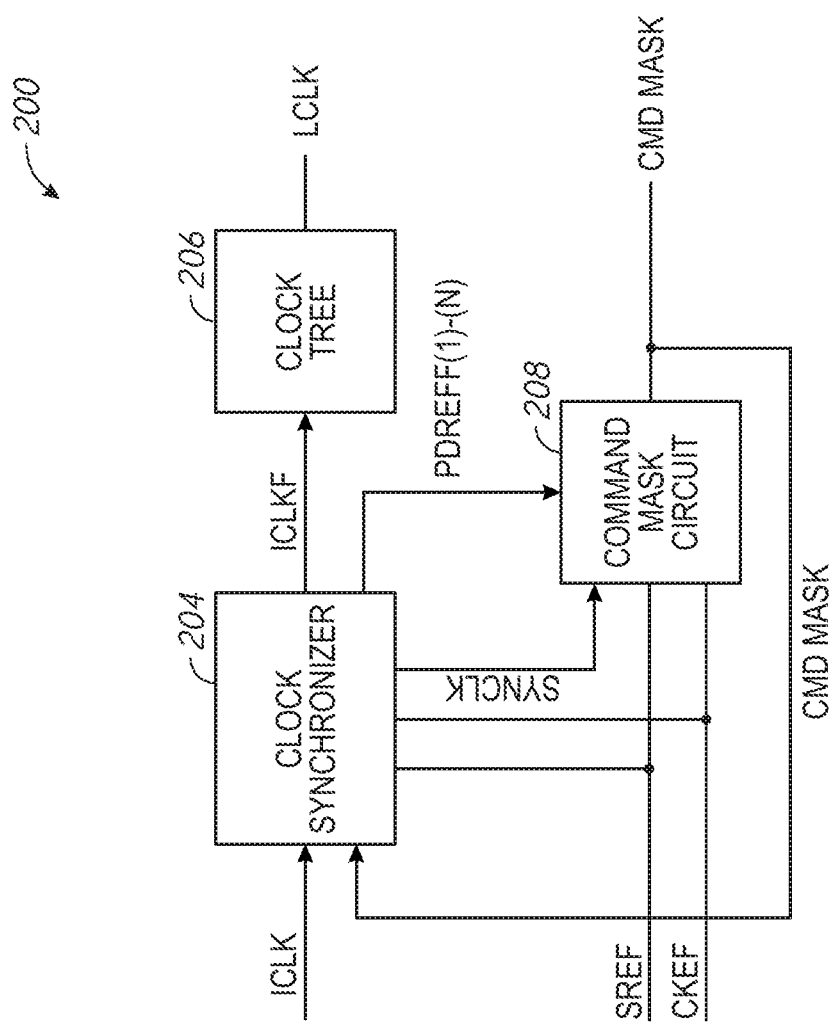
FIG. 2 illustrates a schematic block diagram of an internal clock circuit in a semiconductor in accordance with some examples disclosed herein.

FIG. 2 illustrates a schematic block diagram of an internal clock circuit 200 in a semiconductor in accordance with some examples disclosed herein. For example, the internal clock circuit 200 may be implemented in the internal clock circuit 130 as shown in FIG. 1. In some scenarios, the internal clock circuit 200 may include a clock synchronizer 204 coupled to a clock tree 206 and to a command mask circuit 208. Clock synchronizer 204 may be configured to receive an internal clock signal ICLK, a CMD MASK signal, an active-low clock enable signal CKEF, and an active-low self-refresh mode signal SREFF. In some scenarios, the ICLK signal may be supplied from the clock input circuit (e.g., 120 in FIG. 1). (e.g., the semiconductor device 100 of FIG. 1) The ICLK signal may be based on one of the CK and /CK signal (e.g., during normal operation) or a NBTI CLK signal of FIG. 1. The NBTI CLK signal may have a lower frequency than the CK and /CK signal. In response to transitions of the CKEF to an inactive state, the SREFF signal to an active state, and the CMD MASK signal to an active state (e.g., indicating an exit from a self-refresh mode), the clock synchronizer 204 may be configured to disable provision of a complement of the internal clock signal ICLKF by a number of cycles of the ICLK signal. The CKEF signal may indicate whether input clock buffers of the clock input circuit are enabled, and the SREFF signal may indicate transitions into and out of a self-refresh mode. This delay may have the effect of "cleaning up" the ICLK signal as it is switched from the NBTI clock. The clock synchronizer 204 may include serially-coupled flip flops (FFs) and/or latches configured to receive and propagate the SREFF signal in response to a combination of the ICLK and CMD MASK signals (e.g., a synchronizer clock signal SYNCLK) as active-low power down self-refresh mode signals PDREF(1)-(N). The serially-coupled FFs and/or latches may be reset in response to a transition of the CKEF signal. The clock synchronizer 204 may be configured to provide the PDREF(1)-(N) signals and the SYNCLK signal to the command mask circuit 208.

The ICLKF signal may be provided to a clock tree 206. The clock tree 206 may be configured to provide the LCLK signal at an output based on the ICLKF signal. The clock tree 206 may include DLL, DCC, and/or other circuitry to adjust timing of the LCLK signal relative to the ICLK signal. The LCLK signal may be provided to downstream circuitry of a semiconductor device, such as I/O circuitry (e.g., the input/output circuit 160 of FIG. 1).

The command mask circuit 208 may be coupled to the clock synchronizer 204 and configured to provide the CMD MASK signal based on the SREFF, the PDREFF(1)-(N), the SYNCLK, and the CKEF signals. The command mask circuit 208 may include serially-coupled FFs configured to receive and propagate the PDREFF(N) signal in response to a combination SYNCLK signal, and other logic configured to compare SREFF, PDREFF(1)-(N), and outputs of the serially-coupled flip-flops to set the CMD MASK signal. The serially-coupled FFs may be reset in response to a transition of the CKEF signal.

In operation, the internal clock circuit 200 receives the ICLK, SREFF, and CKEF signals. While the CKEF signal is set to an active state (e.g., indicating that the input clock buffers are disabled) and the SREFF signal is set to an inactive state (e.g., indicating that the internal clock circuit 200 is in a self-refresh mode), the clock synchronizer 204 provides the ICLKF signal based on the ICLK signal, and the clock tree 206 provides the LCLK signal based on the ICLKF signal. While in the self-refresh mode, the ICLK may be based on a NBTI CLK signal, such as the NBTI CLK signal of FIG. 1. In addition, the command mask circuit 208 may provide the CMD MASK signal to an active state (e.g., indicating that command processing is disabled) based on the SREFF signal. In response to CMD MASK signal being set active, the clock synchronizer 204 may provide the ICLK signal as the SYNCLK signal.

In response to a transition of the CKEF signal to an inactive state (e.g., indicating that the input clock buffers are enabled), circuitry of the clock synchronizer 204 and the command mask circuit 208 may be reset, including resetting the PDREFF(1)-(N) signals. In response, output of the ICLKF signal based on the ICLK signal may be disabled. In response to transition of the SREFF signal to an active state (e.g., indicating an exit of the self-refresh mode), circuitry of the clock synchronizer 204 may propagate the SREFF signal to sequentially set the PDREF(1)-(N) signals in response to the SYNCLK signal. After N transitions of the SYNCLK signal from transition of the SREFF signal to the active state, the PDSREFF(N) signal may be set, and in response, the clock synchronizer 204 may enable provision of the ICLKF signal based on the ICLKF signal. Circuitry of the command mask circuit 208 may propagate the PDSREFF(N) signal in response to the SYNCLK signal. After N+M transitions of the SYNCLK signal from transition of the SREFF signal to the active state, the CMD MASK signal may transition to an inactive state (e.g., enabling processing of received commands). In response to the CMD MASK signal transitioning to the inactive state, the SYNCLK signal may be disabled, which may disable circuitry of the clock synchronizer 204 and the command mask circuit 208. Disabling of the ICLKF signal and disabling command processing via the CMD MASK signal in response to an exit from a self-refresh mode for a period of time may prevent erroneous transmitting and receiving of data based on leftover artifacts on the ICLK signal during the exit from the self-refresh mode.

Figure 3:
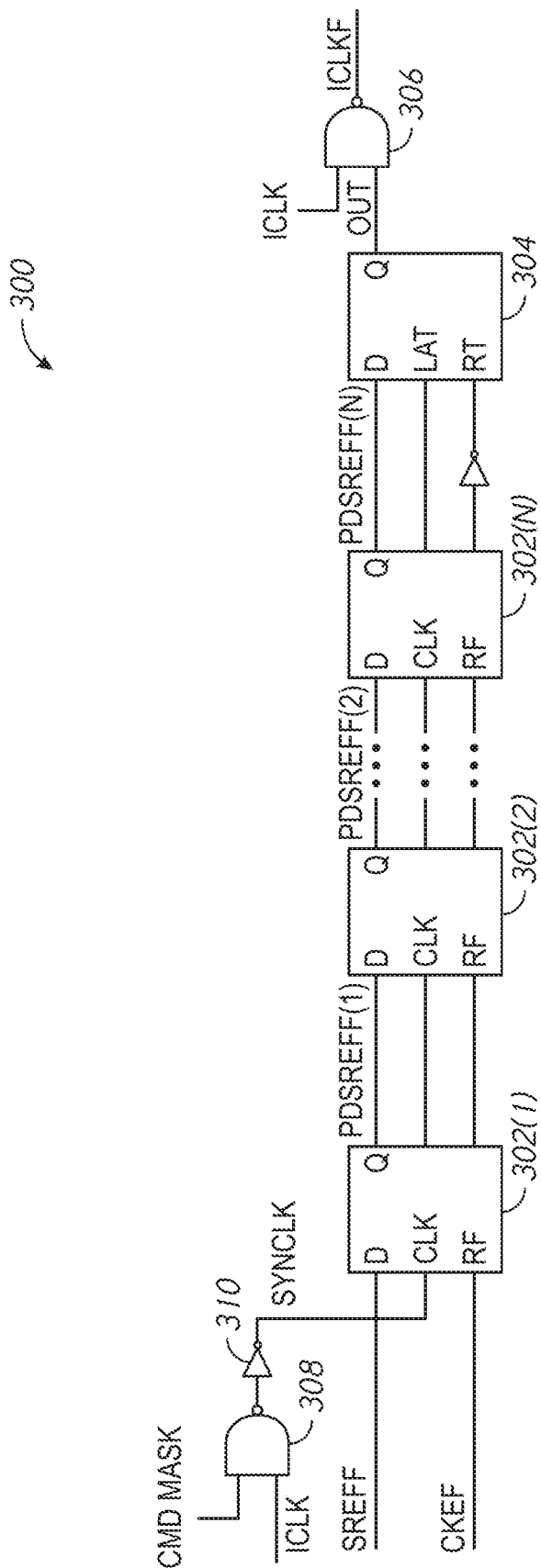
FIG. 3 illustrates a diagram of a clock synchronizer in a semiconductor counter circuit in accordance with some examples disclosed herein.

FIG. 3 illustrates a diagram of an example clock synchronizer 300 in accordance with some examples disclosed herein. The clock synchronizer 300 may be implemented in the internal clock circuit 130 of FIG. 1 and/or the clock synchronizer 204 of FIG. 2.

In some examples, clock synchronizer 300 may include one or more flip-flops, 302(1), 302(2), . . . 302(N) coupled in series. For example, the output of the first flip-flop 302(1) may be coupled to the input of the second flip-flop 302(2) so that a signal may be propagated through the one or more flips 302(1) . . . 302(N). In a non-limiting example, an active-low self-refresh mode signal SREFF may be supplied from a command decoder circuit (e.g., the command decoder 115 of FIG. 1) to an input D of the first flip-flop 302(1), then propagated through the one or more flip-flops 302(1) . . . 302(N). A synchronization signal SYNCLK may be supplied to the clock terminals of each of the flip-flops 302(1) . . . 302(N), and each of the flip-flops 302(1) . . . 302(N) may generate a respective output signal PDSREFF(1), PDSREFF (2), . . . , PDSREFF(N) responsive to the SYNCLK signal. Additionally, the output from the last flip-flop 302(N) may be coupled to a clock gating topology 304. The clock gating topology 304 may include a latch, which may be configured to hold the output of the last flip-flop 302(N) as an output signal OUT. The clock synchronizer 300 may also include a logic gate, such as a NAND gate 306, to generate the ICLKF signal responsive to the OUT signal.

In some scenarios, the clock synchronizer 300 may include a NAND gate 308 coupled to an inverter 310 to provide the SYNCLK signal responsive to the ICLK signal that is coupled to an input of the NAND gate 308. Thus, gate 308 wakes up SYNCLK only when CMDMASK is active e.g., during the NBTI hand-off window. At all other times SYNCLK is disabled. This facilitates power saving in the semiconductor device. The SYNCLK signal may be supplied to clock terminals (CLK) of each of the one or more flip-flops 302(1), . . . 302(N). The SYNCLK signal may also be coupled to a latch terminal (LAT) of the clock gating topology 304.

In operation, while the semiconductor device (e.g., the semiconductor device 100 of FIG. 1) is operating in a self-refresh mode, the SREFF signal may be set to an inactive state. Normally, the SREFF signal would be propagated in response to the SYNCLK signal through the flip-flops 302(1), . . . , 302(N), and latched at an output of the clock gating topology 304. However, the CKEF signal may be set to an active state while in the self-refresh mode, and in response, the active-low reset terminals (RF) of the flip-flops 302(1), . . . , 302(N) and the active high reset terminal RT of the clock gating topology 304 may be held in a reset state (via an inverter). In response to the RF terminals and the RT terminal of the flip-flops 302(1), . . . , 302(N) and the clock gating topology 304, respectively, being held in a reset state, the PDSREFF(1) . . . PDSREFF (N) signals and the OUT signal may all be held at their previously set values. Thus, while in the self-refresh mode, the ICLKF signal continues to be provided based on the ICLK signal (e.g., based on the NBTI CLK signal) to prevent NBTI degradation.

When the semiconductor device (e.g., the semiconductor device 100 of FIG. 1) is in the self-refresh mode, the flip-flops, e.g., 302(1) . . . , 302(N), were in a reset state. When the semiconductor device exits the self-refresh mode, the SREFF signal may transition to an active state and the CKEF signal may transition to an inactive state. In response to the CKEF signal transitioning to the inactive state, the RF terminals of the flip-flops may be released, and the SREF information is clocked through them as further described herein. The OUT signal having an active low value may disable the ICLKF signal via the NAND gate 306. The SREFF signal in the active state may be propagated in response to the SYNCLK signal through one or more flip-flops 302(1), . . . , 302(N) to be supplied to the clock gating topology 304. The propagated SREF signal may be held at the output of the clock gating topology 304 as the OUT signal. The OUT signal transitioning to the active state based on propagation of the SREFF signal may enable the ICLKF signal to transition based on the ICLK signal.

Thus, as described, upon exit of the self-refresh mode, the ICLKF signal is disabled until the SREFF signal being set to an active state propagates through the flip-flops 302(1), . . . 302(N) and the clock gating topology 304 to transition the OUT signal to an active state in response to the SYNCLK signal. In other words, because the SREFF signal set to the active state reaches the clock gating topology 304 with a delay, the toggling of the ICLKF signal transitions from the NBTI CLK signal to the CK and /CK signal also with a delay. This may allow artifacts (e.g., partial or spurious clocks) within circuitry of a semiconductor device to clear before normal operation is resumed, for which CK and /CK clock signals are supplied to ICLKF signal. The number of clock cycles in the delay may be based on the number of flip-flops 302(1), . . . , 302(N) of the clock synchronizer 300. For example, the number of flip-flops may be four, and the toggling from the internal clock signal to the external clock signal will correspondingly delay by four clock cycles.

Additionally, and/or alternatively, the clock synchronizer 300 may also be configured to activate or deactivate the SYNCLK signal. This may provide advantages of deactivating the one or more flip-flops 302(1), . . . , 302(N) of the clock synchronizer 30(when the flip-flops 302(1), . . . , 302(N) are not needed. For example, the clock synchronizer 300 may be configured to receive the CMD MASK signal at the NAND gate 308. While in the self-refresh mode (e.g., for a delay from exit of the self-refresh mode), the CMD MASK signal may be set to an inactive state (e.g., indicating command decoding is disabled). While in normal operation (e.g., after a delay from exit of the self-refresh mode), the command mask signal may be set to an active state (e.g., indicating that command decoding is enabled). While the CMD MASK signal is set to an inactive state, the SYNCLK signal is held at a constant inactive state, thus disabling the SYNCLK signal provided to the one or more flip-flops 302(1), . . . , 302(N).

When the CMD MASK signal is set to an active state the input of the logic NAND gate 308 is high, and the SYNCLK signal may change responsive to the ICLK signal.

When the semiconductor exits the self-refresh mode, the SREFF signal may transition to the active state. During the exiting of self-refresh, the CMD MASK signal remains in the active state for a few clock cycles. This allows the SYNCLK signal to synchronize with the ICLK signal as it transitions from the NBTI CLK signal to the CK/CK signal. Responsive to the SYNCLK signal, the one or more flip-flops 302(1), . . . , 302(N) may propagate the active state of SREFF signal through the last flip-flop 302(N) and the clock gating topology 304 to the OUT signal. After a delay of a number of clock cycles, the CMD MASK signal may transition to an inactive state. In response to the command mask transitioning to an inactive state, the SYNCLK signal is set to a constant active state via the NAND gate 308, thus deactivating the flip-flops 302(1), . . . , 302(N). Correspondingly, the OUT signal from the clock gating topology 304 stays in the active state. This allows the ICLKF signal to synchronize with the ICLK signal via the NAND gate 306. Because the CMD MASK signal arrives with a delay from when the command to exit self-refresh is received, the ICLKF signal, as well as a local clock signal (e.g., the LCLK signals of FIGS. 1 and 2) based on ICLKF may be disabled for a period of time after exiting the self-refresh mode.

Figure 4:
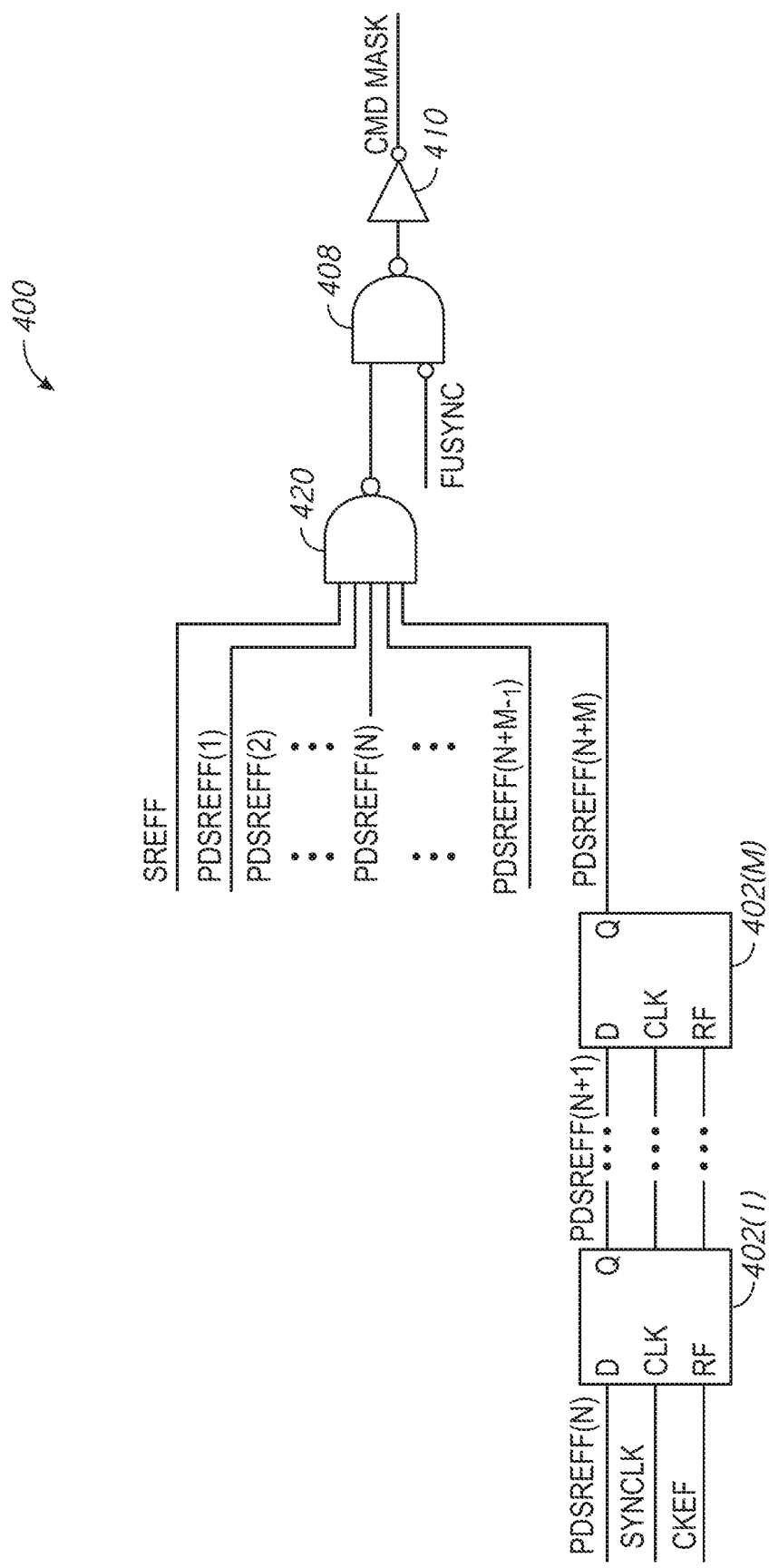
FIG. 4 illustrates a diagram of a command mask circuit in accordance with some examples disclosed herein.

FIG. 4 illustrates a diagram of a command mask circuit 400 in accordance with some examples disclosed herein. The command mask circuit 400 may be implemented in the internal clock circuit 130 of FIG. 1, the command mask circuit 208 of FIG. 2, or combinations thereof.

The command mask circuit 400 may include one or more flip-flops 402(1), . . . , 402(M) coupled in series. For example, the output of the first flip-flop 402(1) may be coupled to the input of the second flip-flop, the output of the second flip-flop coupled to the input of the third flip-flop, so on and so forth, until the last flip-flop 402(M). In such configuration, a signal may be propagated through the one or more flip-flops 402(1) . . . 402(M). In some scenarios, the one or more flip-flops 402(1) . . . 402(M) may also be coupled to one or more flip-flops of a clock synchronizer, such as one or more of the flip-flops 302(1) . . . 302(N) of the clock synchronizer 300 of FIG. 3. For example, the input of the first flip-flop 402(1) of the command mask circuit 400 may be coupled to the output of the last flip-flop of the clock synchronizer 300 of FIG. 3 (e.g., to receive the PDSREFF (N) signal). The clock terminal of each of the flip-flops 402(1) . . . 402(M) may also be coupled to the SYNCLK signal. Thus, the PDSREFF(N) signal may be propagated through the flip-flops 402(1), . . . , 402(M) to provide respective PDSREFF(N) . . . PDSREFF(N+M) signals.

In some scenarios, the command mask circuit 400 may include a clock logic circuit 420 configured to receive the SREFF signal and the output signals from the flip-flops of the clock synchronizer, e.g., the PDSREFF(1), . . . , PDSREFF(N) signals and the output signals from the flip-flops 402(1) . . . 402(M), e.g., the PDSREFF(N+1), . . . , PDSREFF(N+M) signals. In some scenarios, the clock logic circuit 420 may include one or more logic gates, such as one or more NAND gates to accommodate a count of the PDSREFF(1) . . . . PDSREFF(N+M) signals. For example, if the clock synchronizer 300 has four flip-flops, and if the command mask circuit 400 has three flip-flops, then the clock logic circuit 420 may include one NAND gate having 8 inputs (e.g., 7 flip-flops plus the SREFF signal). Alternatively, the clock logic circuit 420 may include two 4-input NAND gates and an OR gate that couples the output of the two NAND gates in parallel. In the instant example, each input of the two NAND gates is coupled to one of the seven inputs from the flip-flops of the clock synchronizer 300 or the command mask circuit 400. The outputs of the two NAND gates are OR'ed through the OR gate.

The command mask circuit 400 may include additional logic gates, e.g., NAND gate 408 and an inverter 410, which are configured to provide the CMD MASK signal. In the example configuration, when the SREFF signal (e.g., the SREFF signal of FIG. 3), which is set to an active state at the exit of self-refresh, has been propagated through each of the flip-flops of the clock synchronizer, and additionally through each of the flip-flops 402(1) . . . 402(M), then the output signals of each of the one or more flip-flops (e.g., 302(1), . . . , 302(N), 402(1), . . . , 402(M)) will become high, causing the clock logic circuit 420 to produce the CMD MASK signal to transition to an inactive state, which indicates that the command decoder (e.g., the command decoder 115 of FIG. 1) is enabled. The CMD MASK signal may be set to the inactive state with a further delay from the output of the last flip-flop of the clock synchronizer e.g., based on the PDSREFF(N) signal of FIG. 3). The delayed CMD MASK signal may be provided to the clock synchronizer to be used to generate the SYNCLK signal (e.g., the SYNCLK signal of FIG. 3).

Figure 5:
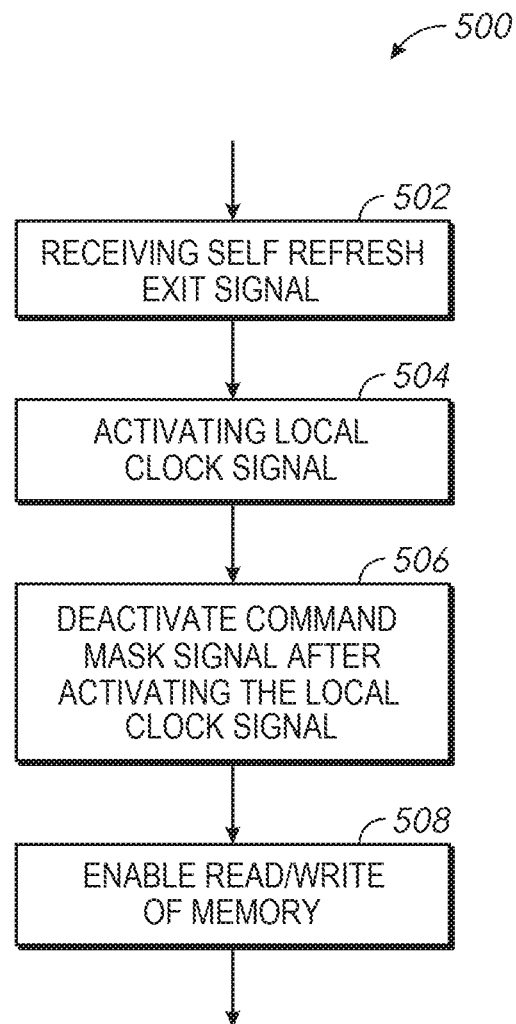
FIG. 5 illustrates an example of a process for enabling reading or writing data from and to a memory device at exit of self-refresh in accordance with some examples disclosed herein.

Various methods may be implemented in the embodiments described with reference to FIGS. 1-4. FIG. 5 illustrates an example method 500 for operation of a semiconductor device in response to exit of a self-refresh mode in accordance with some examples disclosed herein. The method 500 may be performed, all or in part, by the I/O circuit 160 (FIG. 1), the internal clock circuit 130 (FIG. 1), the clock input circuit 120 (FIG. 1), the internal clock circuit 200 (FIG. 2), the clock synchronizer 300 (FIG. 3), the command mask circuit 400 (FIG. 4), or combinations thereof.

The method 500 may include receiving a self-refresh mode signal at an internal clock circuit of a memory array, at 502. The self-refresh mode signal may correspond to the SREF signal of FIGS. 1 and/or 2 and/or the SREFF signal of FIGS. 3 and/or 4, in some examples. The memory array may correspond to the memory cell array 150 of FIG. 1. The internal clock circuit may correspond to the internal clock circuit 130 of FIG. 1 and/or the internal clock circuit 200 of FIG. 2. The self-refresh mode signal may be supplied in response to a command to exit the self-refresh. The self-refresh mode signal may be supplied along with the command to exit the self-refresh CKE from command address input circuit 105 in FIG. 1.

The method 500 may further include enabling a local clock signal responsive to the self-refresh mode signal having a first value, at 504. The first value indicates exit from self-refresh mode. The local clock signal may correspond to the LCLK signal of FIGS. 1 and 2. In some examples, enabling the local clock signal may include propagating the self-refresh mode signal having the first value through a plurality of flip-flops that are coupled in series in a clock synchronizer of the internal clock circuit to enable the local clock signal responsive to a synchronizer clock signal. The clock synchronizer may correspond to the clock synchronizer 204 of FIG. 2 and/or the clock synchronizer 300 of FIG. 3. The plurality of flip-flops may correspond to the flip-flops 302(1), . . . 302(N) of FIG. 3, in some examples. The synchronizer click signal may correspond to the SYNCLK signal of any of FIGS. 2-4.

In some examples, method 500 may also include deactivating a command mask signal CMD MASK a number of clock cycles after activating the local clock signal, at 506. The command mask signal may correspond to the CMD MASK signals of any of FIGS. 1-4. In some examples, the method 500 may further include propagating an output signal of one flip-flop of the plurality of flip-flops of the clock synchronizer through a second plurality of flip-flops of a command mask circuit of the internal clock circuit coupled in series to deactivate the command mask signal responsive to the synchronizer clock signal, wherein the deactivating of the command mask signal is delayed from the enabling of the local clock signal generated by the clock synchronizer by the number of clock cycles. The command mask circuit may correspond to the command mask circuit 208 of FIG. 2 and/or the command mask circuit 400 of FIG. 4. The second plurality of flip-flops may correspond to the flip-flops 402(1), . . . 402(M) of FIG. 4, in some examples. In some examples, the number of delayed clock cycles of the command mask signal is based on a number of flip-flops of the command mask circuit. In some examples, deactivating the command mask signal may include transitioning the command mask signal to a logic low when the self-refresh mode signal having the first value has been propagated through a last of the one or more flip-flops of the clock synchronizer. In some examples, deactivating the command mask signal may include transitioning the command mask signal to the logic low when additionally the self-refresh mode signal having the first value has also been propagated through a last of the one or more flip-flops of the command mask circuit. In some examples, the method 500 may further include enabling the synchronizer clock signal responsive to the command mask signal and an internal clock signal, and disabling the synchronizer clock signal responsive to the deactivation of the command mask signal.

Figure 6:
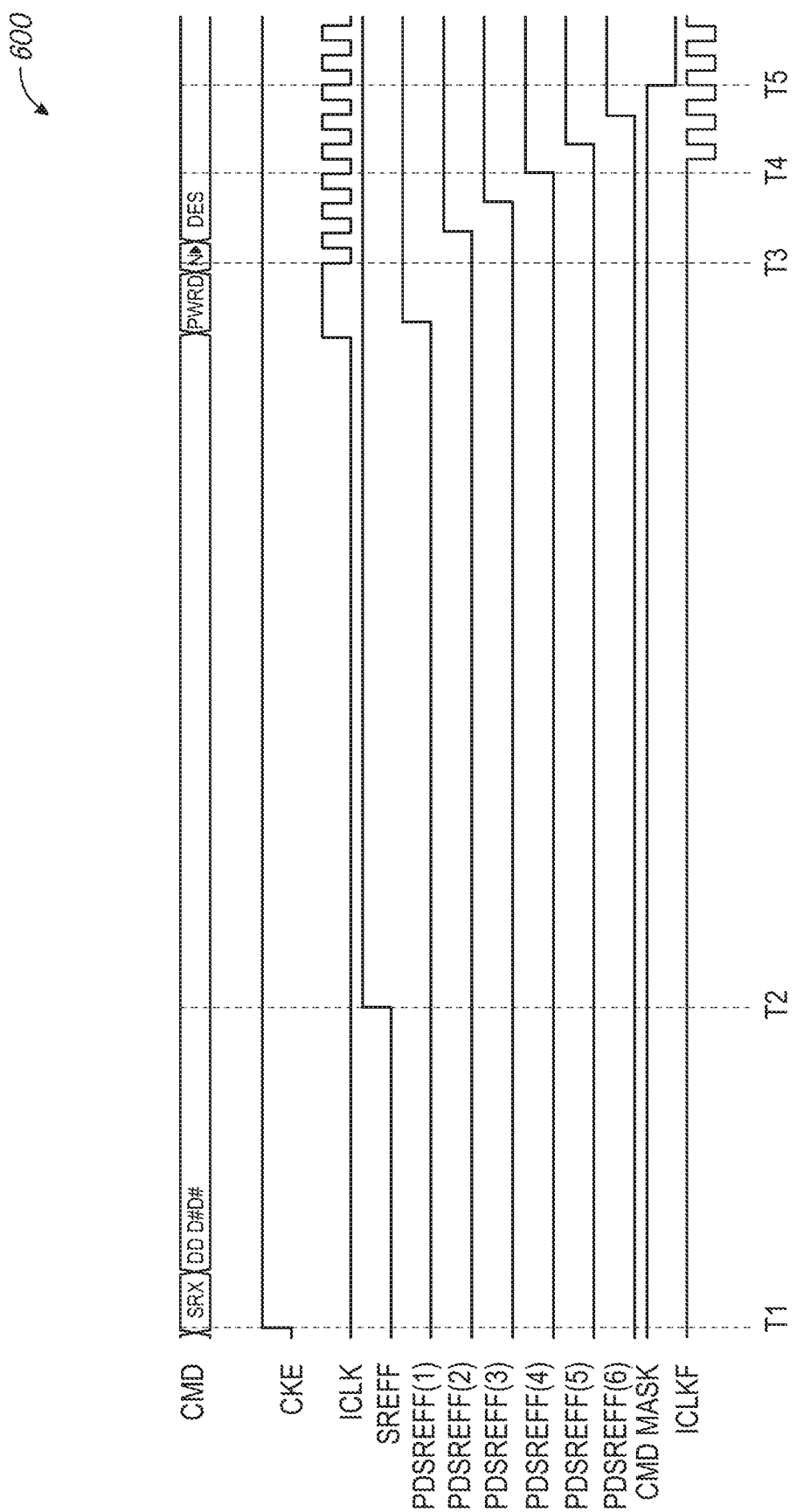
FIG. 6 illustrates an example of a timing diagram of signals in a semiconductor device in accordance with some examples disclosed herein.

FIG. 6 illustrates an example of a timing diagram 600 of operation of a semiconductor device in response to exit of a self-refresh mode in accordance with some examples disclosed herein. The timing diagram 600 may depict operation of the I/O circuit 160 (FIG. 1), the internal clock circuit 130 (FIG. 1), the clock input circuit 120 (FIG. 1), the internal clock circuit 200 (FIG. 2), the clock synchronizer 300 (FIG. 3), the command mask circuit 400 (FIG. 4), or combinations thereof. The command signal CMD may correspond to a signal received via the command and address bus of FIG. 1. The clock enable signal CKE may correspond to the CKE signal of FIG. 1, a complement of the CKEF signals of FIGS. 2-4, or combinations thereof. The internal clock signal ICLK may correspond to the ICLK signals of FIGS. 1-3. The active low self-refresh mode signal SREFF signal may correspond to a complement of the SREF signals of FIGS. 1 and/or 2, the SREFF signals of FIGS. 3 and/or 4, or combinations thereof. The active-low power down self-refresh mode signals PDREFF(1)-(6) may correspond to the PDREFF(1)-(M) signals of FIGS. 3 and 4. For example, in the example of depicted in the timing diagram 600, the clock synchronizer may include 4 flip-flops that correspond to the PDREFF(1)-(4) signals and the command mask circuit may include 2 flip-flops that correspond to the PDREFF(5)-(6) signals. The command mask signal CMD MASK may correspond to the CMD MASK signals of FIGS. 1-4. For example, in the example of depicted in the timing diagram 600, the clock synchronizer may include 4 flip-flops and the command mask circuit may include 2 flip-flops. The active low internal clock signal ICLKF may correspond to the ICLKF signal of FIG. 3.

Prior to time T1, the semiconductor device may be in a self-refresh mode. At time T1, a command line CKE may change from a low logic level to a high logic level, in response to receipt of a command to exit self-refresh. At time T2, in response to the self-refresh exit command, the SREFF signal may change from low to high. The SREFF signal may propagate through one or more flip-flops of a clock synchronizer (e.g., the clock synchronizer 204 of FIG. 2 and/or the clock synchronizer 300 of FIG. 3) as the PDSREFF(1), PDSREFF(2), ..., PDSREFF(6) signals.

At time T3, the ICLK signal may begin transitioning at a higher frequency, indicating a start of an external clock signal, such as the CK and /CK of FIG. 1. However, the ICLKF signal may remain disabled based on the PDSREFF (4) signal having a low logical value.

At time T4, the PDSREFF(4) transitions to a high logical value, and in response, the ICLKF signal may begin transitioning based on the ICLK signal.

Between times T4 and T5, the flip-flops of the clock synchronizer and the command mask circuit may be configured to operate based on the CMD MASK signal having a low logical value. At time T5, the CMD MASK signal may transition to a low in response to the PDREFF(6) signal transitioning to a high logical value. In response to the CMD MASK signal transitioning to the high logical value, the flip-flops of the clock synchronizer and the command mask circuit may be disabled.

The timing diagram 600 is an example for illustrating operation of various described embodiments. Although the timing diagram 600 depicts a particular arrangement of signal transitions of the included signals, one of skill in the art will appreciate that additional or different transitions may be included in different scenarios without departing from the scope of the disclosure. Further, the depiction of a magnitude of the signals represented in the timing diagram 600 is not intended to be to scale, and the representative timing is an illustrative example of a timing characteristics.

The various embodiments in FIGS. 1-6 may be advantageous over existing memory devices and systems in that, in response to the command to exit self-refresh, the ICLKF signal produces full cycle cleaned clock signal. Further, the command mask signal is disabled (causing the command decoder to be ready) after the inverted clock signal has steadily been supplied with the external clock signal. These various features facilitate advantages in reducing the possibility of decoding accidental commands due to transitioning of clock signals at the exit of self-refresh.

From the foregoing it will be appreciated that, although specific embodiments of the disclosure have been described herein for purposes of illustration, various modifications or combinations of various features may be made without deviating from the spirit and scope of the disclosure. For example, the various circuits disclosed herein, such as the clock synchronizer and the command mask circuit of the internal clock circuit (FIG. 2), may include one integrated circuit or multiple circuits. In other scenarios, the clock input circuit (e.g., 120 in FIG. 1) may be stand-alone or part of the internal clock circuit 130 (FIG. 1). The command to exit self-refresh mode CKE and/or the internal NBTI signal may be supplied by the command address input circuit 105 or the command decoder 115. Accordingly, the disclosure is not limited except as by the appended claims.

I claim:

1. An apparatus comprising:
   a clock circuit configured to receive an internal clock signal, and further configured to:
   prior to receipt of a command to exit a self-refresh mode, provide a second clock signal having a lower frequency than that of an external clock signal to an I/O circuit; and
   in response to the receipt of the command to exit the self-refresh mode, provide a third clock signal having a same frequency as that of the external clock signal to the I/O circuit; and
   a switching circuit configured to receive the external clock signal and a fourth clock signal having a lower frequency than that of the external clock, and further configured to, responsive to a control signal associated with the self-refresh mode, control which of the external clock signal or the fourth clock signal is provided at an output of the switching circuit, and provide the internal clock signal based on the external clock signal or based on the fourth clock signal.

2. The apparatus of claim 1, wherein the clock circuit comprises a clock synchronizer configured to provide a synchronization clock signal based on a command mask signal and the internal clock signal.

3. The apparatus of claim 2, wherein the clock circuit further comprises a command mask circuit coupled to the clock synchronizer to receive the synchronization clock signal to provide the command mask signal to the clock synchronizer.

4. The apparatus of claim 3, wherein the command mask signal provided is active during the self-refresh mode, and is inactive responsive to the receipt of the command to exit the self-refresh mode.

5. The apparatus of claim 4, wherein the command mask signal becomes inactive at a time period after receipt of the command to exit the self-refresh mode.

6. The apparatus of claim 1, wherein the switching circuit is configured to:
prior to the receipt of the command to exit the self-refresh mode, switch the fourth clock signal to provide the internal clock signal; and
in response to the receipt of the command to exit the self-refresh mode, switch the external clock signal to provide the internal clock signal.

7. The apparatus of claim 6, wherein the switching circuit is a multiplexer having a terminal coupled to the control signal and configured to switch the fourth clock signal or the external clock signal to provide the internal clock signal responsive to the control signal.

8. A method comprising:
prior to receipt of a command to exit a self-refresh mode, controlling a switching circuit in response to a control signal associated with the self-refresh mode to provide a second clock signal having a lower frequency than that of an external clock signal to an I/O circuit, wherein the switching circuit is configured to receive the external clock signal at a first terminal and receive a fourth clock signal at a second terminal having a lower frequency than that of the external clock signal; and
in response to the receipt of the command to exit the self-refresh mode, controlling the switching circuit in response to the control signal to provide a third clock signal having a same frequency as that of the external clock signal to the I/O circuit.

9. The method of claim 8 further comprising:
providing a synchronization clock signal based on a command mask signal and an internal clock signal, wherein the synchronization clock signal is active during the self-refresh mode.

10. The method of claim 9 further comprising:
providing the command mask signal based on the synchronization signal and a self-refresh control signal.

11. The method of claim 10, wherein the command mask signal provided is active during the self-refresh mode, and is inactive a time period after receipt of the command to exit the self-refresh mode.

12. The method of claim 9 further comprising:
responsive to the control signal, providing the internal clock signal to the clock circuit based on based on the external clock signal or the fourth clock signal.

13. The method of claim 12, wherein the switching circuit is a multiplexer having input terminals configured to receive the external clock signal and the fourth clock signal, a control terminal configured to receive the control signal, and an output terminal configured to provide the external clock signal or the fourth clock signal responsive to the control signal.

14. An apparatus comprising:
an enable circuit configured to receive a command mask signal and an internal clock signal to provide a synchronization clock signal;
one or more first delay circuits coupled in a first pipeline with each of the first delay circuits clocked by the synchronization clock signal, wherein the one or more first delay circuits are configured to:
prior to receipt of a command to exit a self-refresh mode, provide a second clock signal having a lower frequency than that of an external clock signal to an I/O circuit; and
in response to the receipt of the command to exit the self-refresh mode, provide a third clock signal having a same frequency as that of the external clock signal to the I/O circuit; and
a switching circuit configured to receive the external clock signal and a fourth clock signal having a lower frequency than that of the external clock, and further configured to, responsive to a control signal associated with the self-refresh mode, control which of the external clock signal or the fourth clock signal is provided at an output of the switching circuit, and provide the internal clock signal based on the external clock signal or based on the fourth clock signal.

15. The apparatus of claim 14 further comprising an output circuit configured to provide the second clock signal in synchronization with the internal clock signal.

16. The apparatus of claim 15, wherein:
prior to receipt of the command to exit the self-refresh mode, the one or more first delay circuits are configured to maintain an output state to activate the output circuit.

17. The apparatus of claim 14, wherein:
in response to receipt of the command to exit the self-refresh mode, the one or more first delay circuits are configured to propagate a self-refresh control signal associated with the self-refresh mode, wherein the third clock signal is disabled when the self-refresh control signal is being propagated in the first pipeline.

18. The apparatus of claim 17 further comprising one or more second delay circuits coupled in a second pipeline with each of the second delay circuits clocked by the synchronization clock signal, the second pipeline coupled to the first pipeline and configured to further propagate the self-refresh control signal from the first pipeline to provide the command mask signal.

19. The apparatus of claim 18, wherein the command mask signal is active when the self-refresh control signal is being propagated in the first and second pipelines and inactive after the self-refresh control is propagated through the second pipeline.

20. The apparatus of claim 14, wherein each of the one or more first delay circuits comprises a flip-flop circuit.

* * * * *